United States Patent [19]

Norman et al.

[11] 4,282,488
[45] Aug. 4, 1981

[54] NOISE ELIMINATOR CIRCUIT

[75] Inventors: Stanley R. C. Norman; Kam B. Tin, both of Brockville, Canada

[73] Assignee: GTE Automatic Electric Labs Inc., Northlake, Ill.

[21] Appl. No.: 76,042

[22] Filed: Sep. 17, 1979

[51] Int. Cl.³ ............................................. H03K 5/22
[52] U.S. Cl. ................................. 328/112; 307/220 R; 307/247 R; 328/119
[58] Field of Search ............... 307/247 R, 220 R, 232, 307/234, 265; 328/112, 111, 110, 41, 119, 165

[56] References Cited
U.S. PATENT DOCUMENTS

| | | | |
|---|---|---|---|
| 3,379,981 | 4/1968 | Humpherys | 328/112 |
| 3,609,563 | 9/1971 | Zinn | 328/112 |
| 4,034,303 | 7/1977 | Kodaira | 307/247 R |
| 4,063,180 | 12/1977 | Norman | 328/112 |
| 4,095,407 | 6/1978 | Asano et al. | 307/247 R |

Primary Examiner—Stanley D. Miller, Jr.
Assistant Examiner—B. P. Davis
Attorney, Agent, or Firm—Robert J. Black; Gregory G. Hendricks

[57] ABSTRACT

A noise eliminator circuit for use in a decoding circuit. A flip-flop is used to delay a first pulse train by the pulse width of a second pulse train so that pulse level transitions of the first pulse train occur non-coincident with the pulse level transitions of a synchronously generated third pulse train.

4 Claims, 3 Drawing Figures

NOISE ELIMINATOR CIRCUIT

BACKGROUND OF THE INVENTION

(1) Field of the Invention

The present invention relates to decoding circuits and more particularly to a circuit for eliminating noise when simultaneously decoding a plurality of synchronously generated counter output signals.

(2) Description of the Prior Art

In a fully synchronous binary counter the output signals change state at the same time. However, they do not change instantaneously. Consequently when a signal changes state from a logic 0 to a logic 1, it takes a finite rise time to make such transitions. Similarly when a signal changes state from a logic 1 to a logic 0, it takes a finite fall time for that transition.

When two output signals of a counter are to be decoded simultaneously, noise pulses can be generated if one of the signals changes state from a logic 0 to a logic 1 at the same time that the other signal changes state from a logic 1 to a logic 0. A noise pulse results from this overlap in rise and fall times. If the rise time of one signal is faster then the fall time of the other a noise pulse as wide as the fall time can result. These noise pulses may be detected as logic pulses and thus cause logic errors.

This problem has been solved on the prior art through use of a data verification technique as disclosed in U.S. Pat. No. 4,063,180 to S. R. Norman. However, such a technique which relies on noise detection, requires timing, comparison and gating circuitry. This technique does not eliminate noise but merely adapts to its presence.

Accordingly it is an object of the present invention to provide a novel, low cost, minimum component technique of eliminating noise from a decoding circuit.

SUMMARY OF THE INVENTION

The present invention is a circuit which eliminates noise pulses due to overlap of rise and fall times of gated signals in a decoding circuit.

The circuit consists of a flip-flop connected between a counter and a gating circuit. The flip-flop is clocked by a first pulse train having a pulse width shorter than either of the two pulse trains (second and third) to be gated by the gating circuit. The flip-flop operates to dislay the pulse train having the widest pulse width (third pulse train), by the width of a pulse in the pulse train having the shortest pulse width (first pulse train).

Therefore, when the second pulse train is gated with the third pulse train (as delayed), noise pulses are eliminated since the logic level transitions of these pulses trains no longer occur synchronously.

DESCRIPTION OF THE PREFERRED EMBODIMENT

Figure 1:
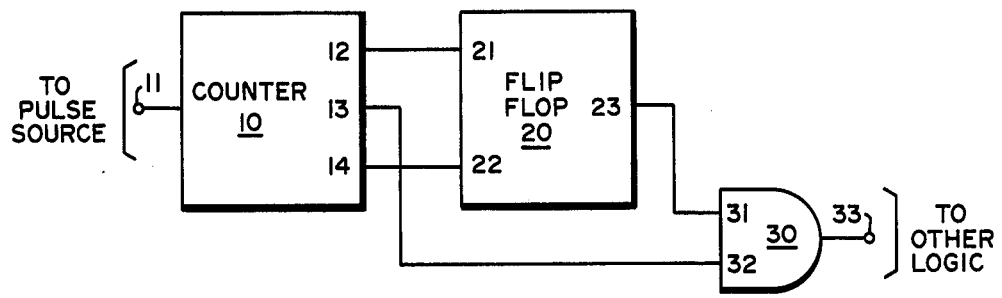
FIG. 1 is a logic diagram of a noise eliminator circuit in accordance with the present invention.

Referring now to FIG. 1, the noise eliminator circuit of the present invention is shown. Counter 10 is shown connected to a pulse source which could typically generate control pulses or periodic pulses. The trigger lead 21 of flip-flop 20 is connected to output 12 of counter 10 and the data lead 22 of flip-flop 20 is connected to output 14 of counter 10. Gate 30 is connected at inputs 31 and 32 to output 23 of flip-flop 20 and to output 13 of counter 10 respectively.

Figure 2:
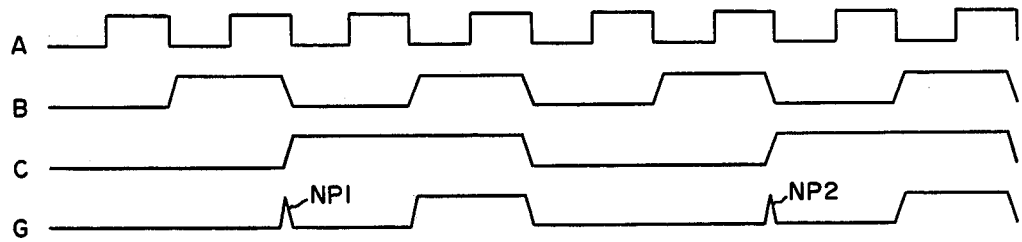
FIG. 2 is a timing diagram showing waveforms of the output signals of the counter of FIG. 1, and waveforms of the noise pulses generated when pulse trains of waveforms B and C are gated.

Counter 10 operates to count the pulses received from the pulse source and generates output signals A, B and C on leads 12, 13 and 14 respectively. The waveforms of signals A, B and C are shown in FIG. 2. If pulse trains B and C are gated, noise pulses NP1 and NP2 would be generated as shown in waveform G. These noise pulses occur where the rising edge of a C pulse overlaps with the falling edge of a B pulse. These noise pulses are eliminated in the present invention by triggering flip-flop 20 at input 21 with pulse train A which has a pulse width shorter than either of the two pulse trains (B and C) to be gated. Of the two pulse trains to be gated, pulse train C, (with its wiper pulse width) is transferred to flip-flop 20 on lead 22.

Flip-flop 20 is a positive edge triggered flip-flop. It operates in response to a rising trigger pulse in pulse train A to transfer the status of pulse train C to its output 23. Therefore pulse train C is delayed by the width of a single pulse in pulse train A, and thus pulse train C' is generated, as shown in waveform C' of FIG. 3.

Figure 3:
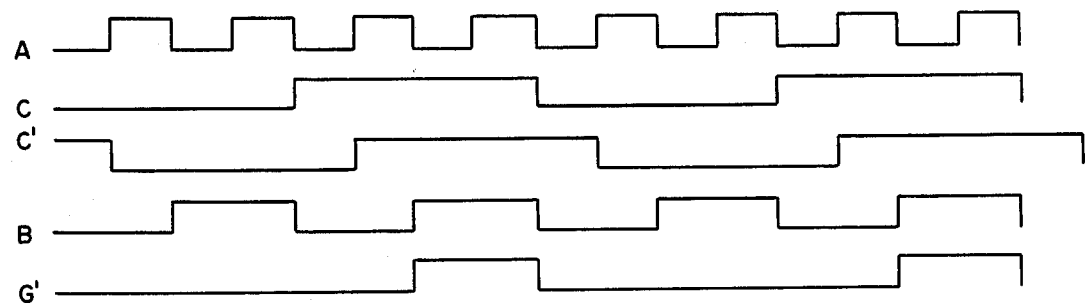
FIG. 3 is a timing diagram showing a waveform for delayed pulse trains C' and the elimination of noise pulses when pulse trains of waveforms B and C' are gated.

Gate 30 operates in response to coincidence of B and C' pulses to generate gated pulse train G', whose waveform is shown in FIG. 3. Pulse train G' does not contain noise pulses since the logic level transitions of pulse trains B and C' do not occur synchronously. However, the pulses of pulse train G' are identical to the valid data pulses shown in waveform G of FIG. 2.

The noise eliminator circuit of the present invention eliminates noise pulses generated when pulse trains containing coincident logic level transitions are gated. A flip-flop delays that pulse train to be gated having the widest pulse width, so that the logic level transitions of the pulse trains to be gated, do not occur synchronously.

It will be obvious to those skilled in the art that numerous modifications of the present invention can be made without departing from the spirit of the invention which shall be limited only by the scope of the claims appended hereto.

What is claimed is:

1. A noise eliminator circuit for use in a decoding circuit including a counter with at least first, second and third outputs, said counter operated in response to an external pulse source to generate at said first, second and third outputs respectively a first pulse train having a pulse width of a first characteristic, a second pulse train having a pulse width of a second characteristic and being greater than said first pulse train characteristic, and a third pulse train having a pulse width of a third characteristic and being greater than said second pulse train characteristic, and a gate circuit including first and second inputs connected to said second and third counter outputs, and an output, operated in response to coincident pulses from said second and third pulse trains to generate a gate signal at said output;

the improvement comprising the inclusion of a delay circuit connected between said third output and said gate circuit and including an input connected to said first counter output, operated in response to said first pulse train to delay said third pulse train by said pulse width of said first pulse train.

2. A noise eliminator circuit as claimed in claim 1, wherein: said delay circuit comprises a D-type flip-flop.

3. A noise eliminator circuit as claimed in claim 2, wherein: said delay flip-flop comprises an edge triggered D-type flip-flop.

4. A noise eliminator circuit as claimed in claim 3, wherein: said edge triggered D-type flip-flop comprises a positive edge triggered D-type flip-flop.

* * * * *